(12) United States Patent
Guo

(10) Patent No.: US 10,868,277 B2
(45) Date of Patent: Dec. 15, 2020

(54) ORGANIC LIGHT EMITTING DIODE DISPLAY PANEL AND MANUFACTURING METHOD THEREOF

(71) Applicant: Wuhan China Star Optoelectronics Semiconductor Display Technology Co., Ltd., Wuhan (CN)

(72) Inventor: Tianfu Guo, Wuhan (CN)

(73) Assignee: Wuhan China Star Optoelectronics Semiconductor Display Technology Co., Ltd., Wuhan (CN)

( * ) Notice: Subject to any disclaimer, the term of this patent is extended or adjusted under 35 U.S.C. 154(b) by 108 days.

(21) Appl. No.: 16/316,350

(22) PCT Filed: Dec. 18, 2018

(86) PCT No.: PCT/CN2018/121792
§ 371 (c)(1),
(2) Date: Jan. 9, 2019

(87) PCT Pub. No.: WO2020/056953
PCT Pub. Date: Mar. 26, 2020

(65) Prior Publication Data
US 2020/0091463 A1 Mar. 19, 2020

(30) Foreign Application Priority Data

Sep. 19, 2018 (CN) .......................... 2018 1 1091055

(51) Int. Cl.
H01L 51/52 (2006.01)
H01L 51/00 (2006.01)
H01L 51/56 (2006.01)

(52) U.S. Cl.
CPC ...... *H01L 51/5275* (2013.01); *H01L 51/0005* (2013.01); *H01L 51/5253* (2013.01); *H01L 51/56* (2013.01)

(58) Field of Classification Search
CPC ............. H01L 51/5275; H01L 51/0005; H01L 51/5253
(Continued)

(56) References Cited

U.S. PATENT DOCUMENTS

2011/0045055 A1* 2/2011 Hingston .............. A61L 31/146
424/424
2016/0064689 A1 3/2016 Xie
(Continued)

FOREIGN PATENT DOCUMENTS

| CN | 1612659 | 5/2005 |
| CN | 103956373 | 7/2014 |

(Continued)

*Primary Examiner* — Elias Ullah

(57) ABSTRACT

An organic light emitting diode (OLED) display panel includes a thin film transistor (TFT) array substrate; an OLED light-emitting layer; an encapsulation layer; an inducing layer disposed on a light-emitting side of the OLED light-emitting layer; a micro lens array film disposed over the inducing layer; and an organic hydrophobic layer disposed between the inducing layer and the micro lens array film. By providing the organic hydrophobic layer with strong hydrophobic performance, a surface with a large water contact angle is provided for a subsequent formation of the micro lens array film, thereby improving an optical coupling ratio of the micro lens, and improving luminous efficiency of the OLED light emitting layer.

7 Claims, 4 Drawing Sheets

(58) Field of Classification Search
USPC .......................................................... 257/40
See application file for complete search history.

(56) References Cited

U.S. PATENT DOCUMENTS

2018/0183009 A1    6/2018  Chen et al.
2018/0241003 A1    8/2018  Huang et al.
2020/0020892 A1*   1/2020  Kishimoto ............. H05B 33/10

FOREIGN PATENT DOCUMENTS

| CN | 106129267 | 11/2016 |
| CN | 106784365 | 5/2017 |
| CN | 108198836 | 6/2018 |

* cited by examiner

ORGANIC LIGHT EMITTING DIODE DISPLAY PANEL AND MANUFACTURING METHOD THEREOF

RELATED APPLICATIONS

This application is a National Phase of PCT Patent Application No. PCT/CN2018/121792 having International filing date of Dec. 18, 2018, which claims the benefit of priority of Chinese Patent Application No. 201811091055.2 filed on Sep. 19, 2018. The contents of the above applications are all incorporated by reference as if fully set forth herein in their entirety.

FIELD AND BACKGROUND OF THE INVENTION

The present disclosure relates to the field of display technologies, and more particularly to an organic light emitting diode (OLED) display device and a manufacturing method thereof.

OLED devices have advantages of being light weight, wide viewing angles, fast response times, low temperature resistance, high luminous efficiency, etc., and have received extensive attention in the display field. Especially, OLEDs can be made into flexible displays on flexible substrates, making OLEDs having a broader application prospect. However, light-emitting efficiency of OLED devices is still low, so how to effectively improve the light-emitting efficiency of OLED devices is still a difficult challenge.

Related researches have shown that doping an appropriate amount of small-sized transparent particles in the light penetrating film layer can improve light-emitting efficiency of the film layer. A micro lens technology currently under study is based on this theory. The current micro lens process is mainly realized by using ink jet printing (IJP) technology. However, materials commonly used in the IJP process contain polar functional groups such as a carbonyl group, so that a polarity of the ink is large. Therefore, if the micro lens process is printed on a surface of the film having a small water contact angle, the resulting micro lens film has low luminous efficiency.

SUMMARY OF THE INVENTION

The present disclosure provides an OLED display panel, which can solve a problem of low luminous efficiency of an existing OLED display panel.

In order to solve the above problem, the technical solution provided by the present disclosure is as follows:

The present disclosure provides an organic light emitting diode (OLED) display panel, including: a thin film transistor (TFT) array substrate; an OLED light-emitting layer disposed on the TFT array substrate; an encapsulation layer disposed over the OLED light-emitting layer; an inducing layer disposed on a light-emitting side of the OLED light-emitting layer; a micro lens array film disposed over the inducing layer; and an organic hydrophobic layer disposed between the inducing layer and the micro lens array film, where the organic hydrophobic layer is prepared by atomic layer deposition.

In at least one embodiment of the present disclosure, the OLED light-emitting layer comprises sub-pixels disposed on the TFT array substrate arranged in an array.

In at least one embodiment of the present disclosure, the inducing layer is disposed between the TFT array substrate and the sub-pixels.

In at least one embodiment of the present disclosure, the inducing layer is disposed between the sub-pixels and the encapsulation layer.

In at least one embodiment of the present disclosure, the organic hydrophobic layer is disposed on a surface of the inducing layer, and molecular structure of the organic hydrophobic layer is arranged in a direction perpendicular to the TFT array substrate, and an outer molecule of the organic hydrophobic layer is a hydrophobic group.

The present disclosure also provides a manufacturing method of an organic light emitting diode (OLED) display panel, including:

S10, providing a thin film transistor (TFT) array substrate, and forming an OLED light-emitting layer on the TFT array substrate;

S20, forming an inducing layer on the OLED light-emitting layer;

S30, forming an organic hydrophobic layer on a surface of the inducing layer by atomic layer deposition;

S40, forming a micro lens array film on a surface of the organic hydrophobic layer; and S50, forming an encapsulation layer on the micro lens array film.

In at least one embodiment of the present disclosure, the S30 comprises:

depositing at least two precursor compounds alternately on the surface of the inducing layer to obtain a polymer grown perpendicular to the TFT array substrate; and controlling an outer molecule of the polymer to be a hydrophobic group to form the organic hydrophobic layer.

In at least one embodiment of the present disclosure, the S40 comprises:

forming an array of pre-polymer droplets on the surface of the organic hydrophobic layer by ink jet printing; and curing the pre-polymer droplets to obtain the micro lens array film.

In at least one embodiment of the present disclosure, the inducing layer is made from amino thiol compounds.

The present disclosure also provides an organic light emitting diode (OLED) display panel, including: a thin film transistor (TFT) array substrate; an OLED light-emitting layer disposed on the TFT array substrate; an encapsulation layer disposed over the OLED light-emitting layer; an inducing layer disposed on a light-emitting side of the OLED light-emitting layer; a micro lens array film disposed over the inducing layer; and an organic hydrophobic layer disposed between the inducing layer and the micro lens array film.

In at least one embodiment of the present disclosure, the OLED light-emitting layer comprises sub-pixels disposed on the TFT array substrate arranged in an array.

In at least one embodiment of the present disclosure, the inducing layer is disposed between the TFT array substrate and the sub-pixels.

In at least one embodiment of the present disclosure, the inducing layer is disposed between the sub-pixels and the encapsulation layer.

In at least one embodiment of the present disclosure, the organic hydrophobic layer is disposed on a surface of the inducing layer, and molecular structure of the organic hydrophobic layer is arranged in a direction perpendicular to the TFT array substrate, and an outer molecule of the organic hydrophobic layer is a hydrophobic group.

The advantages of the present disclosure are: by providing an organic hydrophobic layer with strong hydrophobic performance in an OLED light-emitting region, it can provide a film surface with a larger contact angle for a subsequent formation of the micro lens array film, thereby improving an optical coupling ratio of the micro lens, and increasing luminous efficiency of the OLED light-emitting layer.

BRIEF DESCRIPTION OF THE SEVERAL VIEWS OF THE DRAWINGS

In order to more clearly describe the technical solutions of the embodiments of the present disclosure, accompanying drawings to be used in the detailed description of the disclosure will be briefly described hereinbelow. Obviously, the accompanying drawings described hereinbelow only illustrate some of the embodiments of the present disclosure, and those of ordinary skill in the art can also obtain other accompanying drawings therefrom without the need of making inventive efforts.

DESCRIPTION OF SPECIFIC EMBODIMENTS OF THE INVENTION

Figure 1:
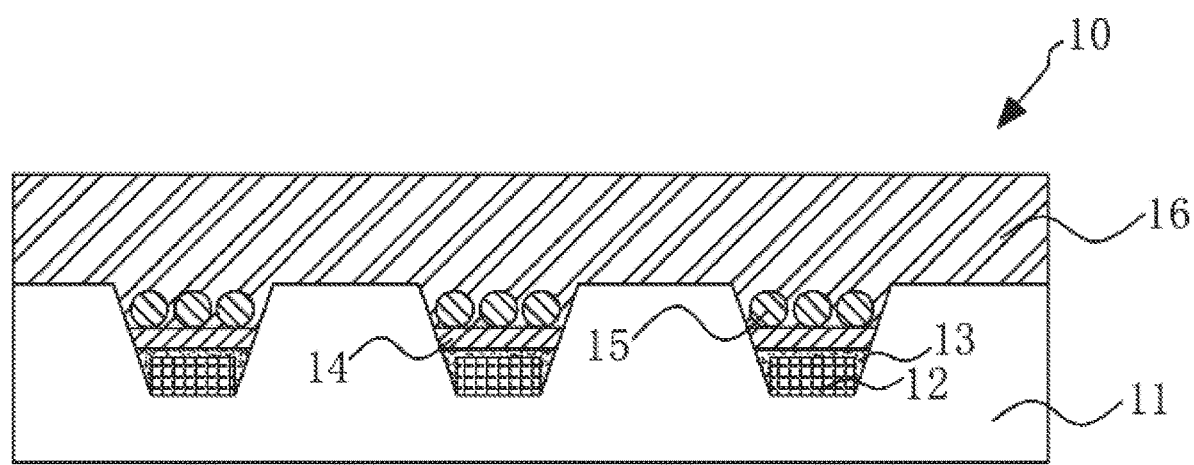
FIG. 1 is a schematic diagram of an OLED display device of a first embodiment of the present disclosure.
Figure 2:
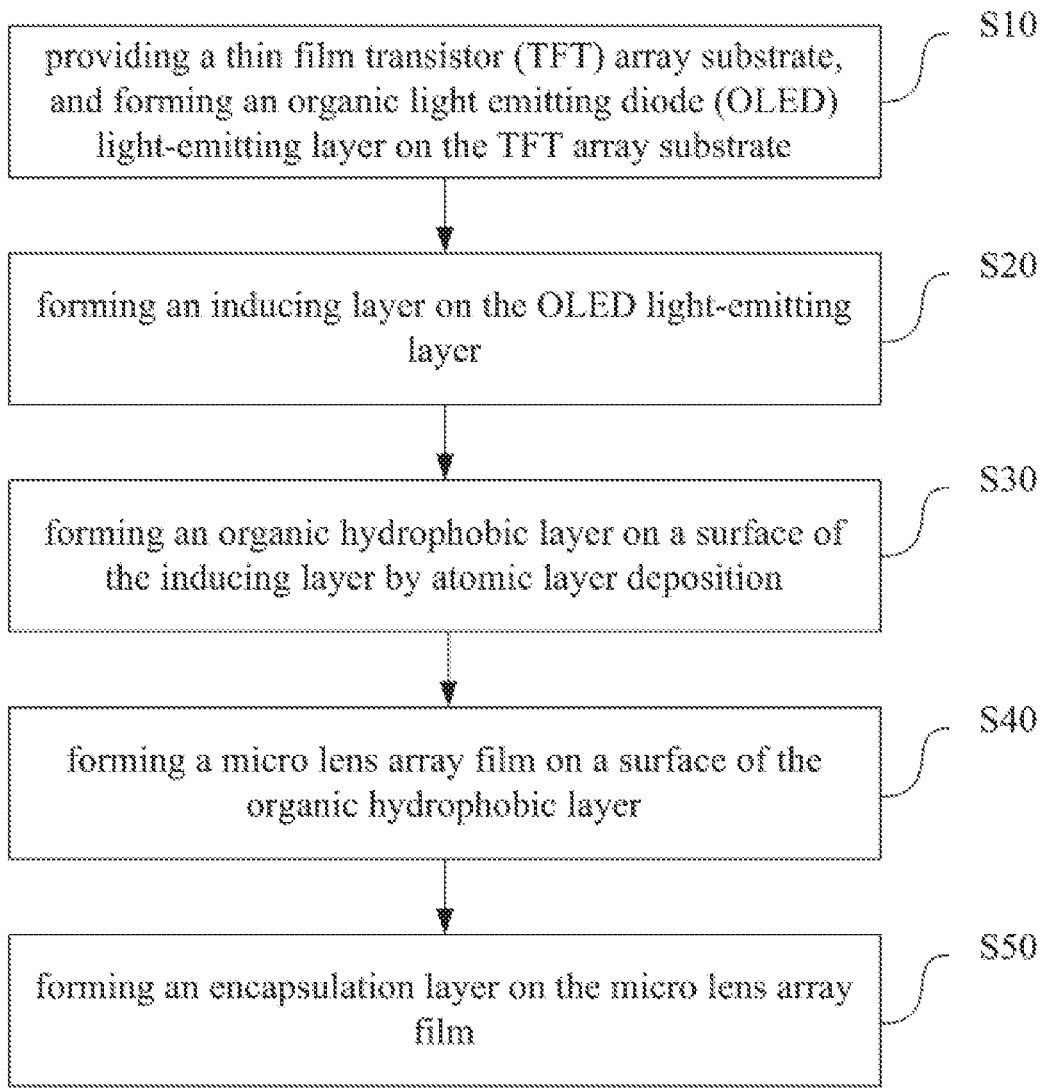
FIG. 2 is a flowchart of manufacturing method of an OLED display device of the present disclosure.
Figure 3:
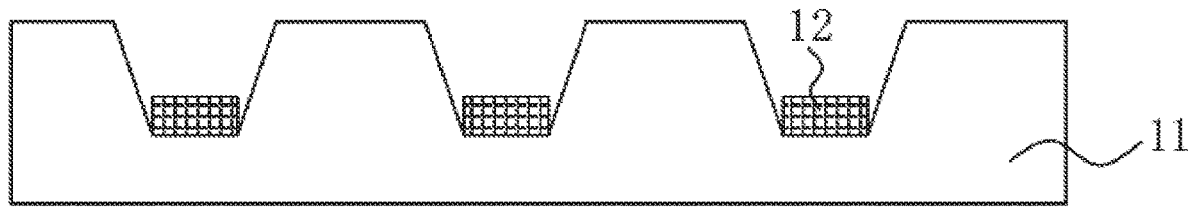
FIG. 3, FIG. 4, FIG. 5 and FIG. 6 are schematic diagrams showing a manufacturing process of the OLED display device of the present disclosure.
Figure 4:
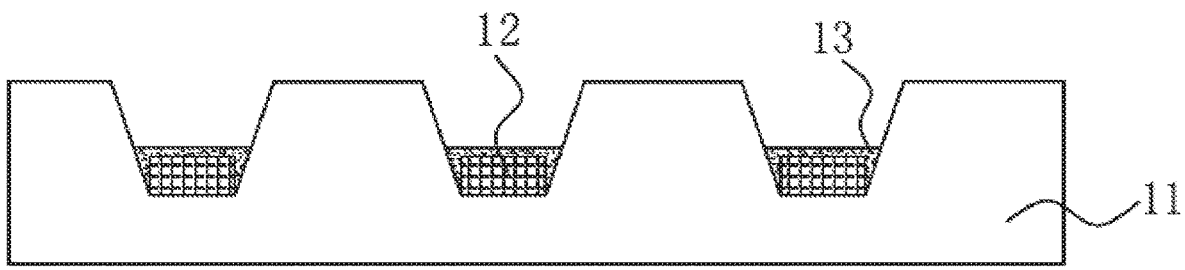
Figure 5:
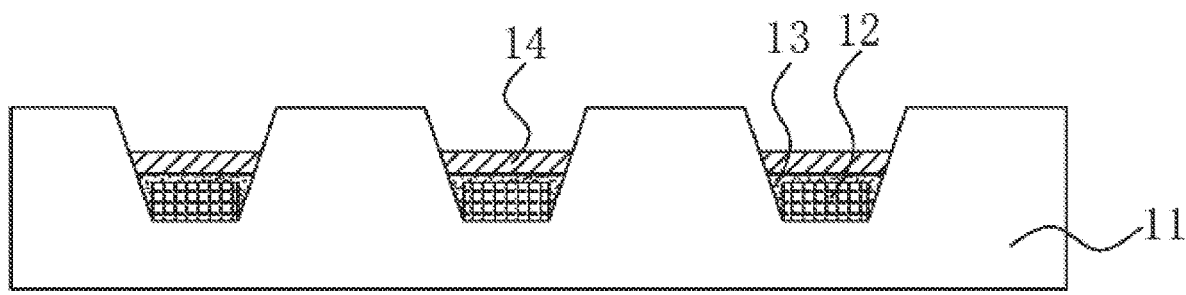
Figure 6:
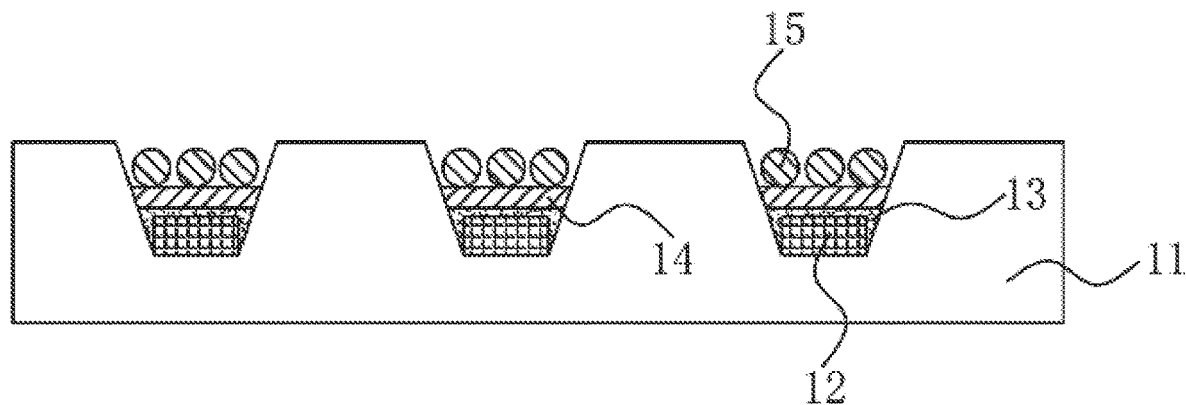

The following embodiments refer to the accompanying drawings for exemplifying specific implementable embodiments of the present disclosure. Moreover, directional terms described by the present disclosure, such as upper, lower, front, back, left, right, inner, outer, side, etc., are only directions by referring to the accompanying drawings, and thus the used directional terms are used to describe and understand the present disclosure, but the present disclosure is not limited thereto. In the drawings, the same reference symbol represents the same or similar components.

The invention is directed to an existing OLED display panel. Since a micro lens structure is arranged on an OLED device, the micro lens is usually prepared by using ink jet printing technology, and ink droplets have a relatively large polarity and are printed on a surface of the film with a small contact angle. The surface of the film is easily wetted, which causes the luminous efficiency of the obtained micro lens film to be low, thereby decreasing the luminous efficiency of the OLED device. This embodiment can solve the drawback.

As shown in FIG. 1, the present disclosure provides an OLED display panel 10, including: a thin film transistor (TFT) array substrate 11; an OLED light-emitting layer 12 disposed on the TFT array substrate 11; an inducing layer 13 disposed on a light-emitting side of the OLED light-emitting layer 12; a micro lens array film 15 disposed over the inducing layer 13; an organic hydrophobic layer 14 disposed between the inducing layer 13 and the micro lens array film 15; and an encapsulation layer 16 disposed over the OLED light-emitting layer.

In this embodiment, the OLED light-emitting layer 12 is a top light emitting structure, and the inducing layer is disposed between the OLED light-emitting layer 12 and the encapsulation layer 16.

A pixel defining layer is disposed on the TFT array substrate 11. The pixel defining layer is provided with a plurality of via holes for accommodating a partial structure of the OLED light-emitting layer 12.

The OLED light-emitting layer 12 includes a plurality of R, G, and B sub-pixels disposed in an array, and the sub-pixels are disposed in via holes of the pixel defining layer.

The micro lens array film 15 includes a plurality of micro lenses arranged in an array, and the micro lenses are disposed corresponding to the sub-pixels to increase the luminous efficiency of the OLED.

The inducing layer 13 is disposed on surfaces the sub-pixels, and the inducing layer 13 covers the sub-pixels. The organic hydrophobic layer 14 is disposed on a surface of the inducing layer 13, and the micro lens array film 15 is disposed on a surface of the organic hydrophobic layer.

Generally, the micro lenses are formed by ink jet printing technology, and the printed ink material usually contains a carbonyl group, which has a large polarity, so it needs to be prepared on a hydrophobic surface.

The organic hydrophobic layer 14 provided by the present disclosure is formed by atomic layer deposition, and the inducing layer 13 can control a molecular structure of the hydrophobic film layer deposited on the surface thereof to be aligned in a direction perpendicular to the TFT array substrate 11. Also, by controlling the material of the last deposited precursor, the outer molecule of the organic hydrophobic layer 14 is a hydrophobic group.

An ink jet printing technique is used to print a very thin film growth inducing material in the corresponding sub-pixel region, which is then cured to become the inducing layer 13. The material of the inducing layer 13 is selected from amino thiol compounds. In the present embodiment, 11-aminoundecane-1-thiol hydrochloride was used as a material for forming the inducing layer 13.

If a hydrophobic film layer is directly deposited on the OLED light-emitting layer 12, and the hydrophobic film layer is grown in a plane or randomly stacked, the position of the hydrophobic group cannot be controlled, and the hydrophobic performance of the hydrophobic film layer is not ideal, such that the luminous efficiency of the micro lenses formed on the surface of the hydrophobic film layer is not satisfactory. By providing the inducing layer 13, the hydrophobic film layer grown on the surface thereof can be grown in a certain direction, thereby controlling the position of the hydrophilic group or the hydrophobic group in the molecular structure, and controlling the group outside the molecular structure to be hydrophobic, so that the hydrophobic properties of the film is enhanced.

Two or more precursor compounds are alternately deposited on the surface of the inducing layer 13 repeatedly, the polarities of the precursor compounds may be different, but at least one precursor compound is a hydrophobic compound. The deposited precursor compound is attached to the surface of the inducing layer 13 to cause polymerization and obtain a layer of molecular structure having a directional alignment, thereby controlling the functional group outside the film layer is a hydrophobic functional group.

The first precursor used in the atomic layer deposition is an amino compound, and the second precursor is an aldehyde-based compound. Specifically, the first precursor is aniline, and the second precursor is terephthalaldehyde. The surface of the inducing layer 13 is alternately deposited aniline and terephthalaldehyde. The deposition of a predetermined thickness of the outer layer of the film layer is controlled a hydrophobic group, that is, the aniline is deposited for the last time, and the inducing layer 13 in which the molecular structure is aligned perpendicular to the TFT array substrate 11 is obtained. Deposition with a benzene ringcontaining precursor compound provides a rigid support for the molecular structure of the film.

A sub-pixel region may correspond to a plurality of micro lenses. The micro lens is spherical. The micro lens 15 is formed by an ink jet printing method. Generally, the material used in the micro lens manufactured by ink jet printing has a large polarity. It is necessary to print on the surface of the film with a large water contact angle to prepare a micro lens with good performance. The surface of the organic hydrophobic layer 14 has strong hydrophobicity, and the surface has a large water contact angle, which is favorable for printing the micro lens material on the surface thereof. The printed ink droplets are cured to form micro lenses distributed in an array.

The encapsulation layer 16 is disposed on the surface of the micro lens array film 15. The encapsulation layer 16 covers the OLED light-emitting layer 12. The encapsulation layer is used to prevent water and oxygen from corroding the OLED device. The encapsulation layer may form a multi-layer package structure by disposing an organic layer and an inorganic layer layer-by-layer.

In other embodiments, the OLED light-emitting layer can be a bottom light emitting structure. The inducing layer is disposed between the OLED light-emitting layer and the TFT array substrate. Specifically, the inducing layer is disposed on the TFT array substrate. The organic hydrophobic layer is disposed on a side of the inducing layer facing away from the TFT array substrate. The micro lens film is disposed on a side surface of the organic hydrophobic layer facing away from the TFT array substrate.

As shown in FIG. 2 to FIG. 6, the present disclosure further provides a manufacturing method of an OLED display panel according to the first embodiment, which includes:

S10, providing a TFT array substrate 11, and forming an OLED light-emitting layer 12 on the TFT array substrate 11;

S20, forming an inducing layer 13 on the OLED light-emitting layer 12;

S30, forming an organic hydrophobic layer 14 on a surface of the inducing layer 13 by atomic layer deposition;

S40, forming a micro lens array film 15 on a surface of the organic hydrophobic layer 14; and S50, forming an encapsulation layer 16 on the micro lens array film.

Specifically, the TFT array substrate 11 includes an active layer, a source, a drain, a gate, a gate insulating layer, a pixel defining layer, and the like, and the pixel defining layer is provided with a plurality of via holes.

The OLED light-emitting layer 12 is formed in the via holes. The OLED light-emitting layer 12 is a top emission type structure, including an anode formed by vacuum evaporation, a hole injection layer, a hole transport layer, a luminescent material layer, an electron transporting layer, an electron injecting layer, and a cathode, where the anode is made from a material having high reflectivity and a high work function, and the cathode is made from a material having high transmission and low work function.

A growth inducing material is printed on the surface of the cathode by ink jet printing technology, and after curing, the inducing layer 13 is formed. The inducing layer 13 is made from amino thiol compounds, and in particularly to 11-aminoundecane-1-thiol hydrochloride.

Figure 7:
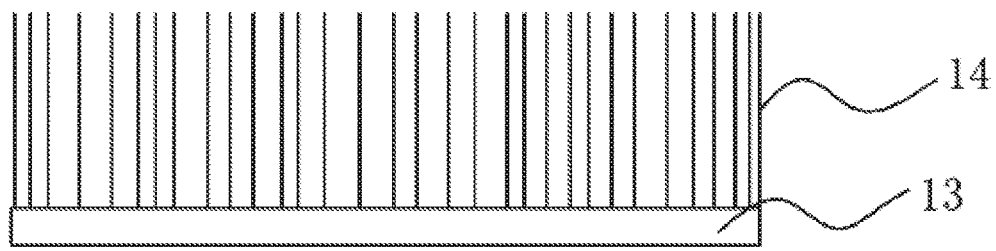
FIG. 7 is a schematic diagram showing a molecular arrangement direction of an organic hydrophobic layer of the present disclosure.

The organic hydrophobic layer 14 is formed on the surface of the inducing layer 13 by atomic layer deposition. At least two precursor compounds are alternately deposited on the surface of the inducing layer 13 repeatedly. After polymerization, a polymer having a molecular structure perpendicular to the TFT array substrate is formed As shown in FIG. 7, due to the action of the inducing layer 13, the precursor has a strong directivity upon deposition. The molecular chains of all molecules after deposition are vertically aligned with respect to the TFT array substrate. Specifically, aniline may be used as the first precursor, and terephthalaldehyde is the second precursor. The polymer is formed by alternately depositing on the surface of the inducing layer 13 in the form of a pulse. Since the aldehyde group in terephthalaldehyde is a hydrophilic group which cannot be arranged on the outer side of the polymer, the last deposited precursor compound is aniline. The benzene ring in aniline is a hydrophobic group, which is arranged on the outer side of the polymer, making the polymer highly hydrophobic.

The pre-polymer droplets distributed in an array are printed on the surface of the organic hydrophobic layer 14 by an ink jet printing technology, and the pre-polymer droplets are further subjected to a curing treatment to obtain the micro lens array film 15.

The above descriptions are merely preferable embodiments of the present disclosure, and are not intended to limit the scope of the present disclosure. Any modification or replacement made by those skilled in the art without departing from the spirit and principle of the present disclosure should fall within the protection scope of the present disclosure. Therefore, the protection scope of the present disclosure is subject to the appended claims.

What is claimed is:

1. An organic light emitting diode (OLED) display panel, comprising:
a thin film transistor (TFT) array substrate;
an OLED light-emitting layer disposed on the TFT array substrate;
an encapsulation layer disposed over the OLED light-emitting layer;
an inducing layer disposed on a light-emitting side of the OLED light-emitting layer;
a micro lens array film disposed over the inducing layer; and
an organic hydrophobic layer disposed between the inducing layer and the micro lens array film, wherein the organic hydrophobic layer is disposed on a surface of the inducing layer, and molecular structure of the organic hydrophobic layer is arranged in a direction perpendicular to the TFT array substrate, and an outer molecule of the organic hydrophobic layer is a hydrophobic group.

2. The OLED display panel as claimed in claim 1, wherein the OLED light-emitting layer comprises sub-pixels disposed on the TFT array substrate arranged in an array.

3. The OLED display panel as claimed in claim 2, wherein the inducing layer is disposed between the TFT array substrate and the sub-pixels.

4. The OLED display panel as claimed in claim 2, wherein the inducing layer is disposed between the sub-pixels and the encapsulation layer.

5. A manufacturing method of an organic light emitting diode (OLED) display panel, comprising:
S10, providing a thin film transistor (TFT) array substrate, and forming an OLED light-emitting layer on the TFT array substrate;
S20, forming an inducing layer on the OLED light-emitting layer;

S30, forming an organic hydrophobic layer on a surface of the inducing layer by atomic layer deposition, wherein the S30 comprises:
    depositing at least two precursor compounds alternately on the surface of the inducing layer to obtain a polymer grown perpendicular to the TFT array substrate; and
    controlling an outer molecule of the polymer to be a hydrophobic group to form the organic hydrophobic layer;

S40, forming a micro lens array film on a surface of the organic hydrophobic layer; and S50, forming an encapsulation layer on the micro lens array film.

6. The manufacturing method as claimed in claim 5, wherein the S40 comprises:
    forming an array of pre-polymer droplets on the surface of the organic hydrophobic layer by ink jet printing; and
    curing the pre-polymer droplets to obtain the micro lens array film.

7. The manufacturing method as claimed in claim 5, wherein the inducing layer is made from amino thiol compounds.

\* \* \* \* \*